United States Patent [19]

Sandy et al.

[11] 4,151,492
[45] Apr. 24, 1979

[54] SURFACE ACOUSTIC WAVE GRATING

[75] Inventors: Frank Sandy, Lexington; Clarence J. Dunnrowicz, Waltham, both of Mass.

[73] Assignee: Raytheon Company, Lexington, Mass.

[21] Appl. No.: 869,880

[22] Filed: Jan. 16, 1978

[51] Int. Cl.² .................. H03H 9/02; H03H 9/32; H03H 9/26
[52] U.S. Cl. ..................... 333/191; 333/193; 333/153
[58] Field of Search ............ 333/72, 30 R; 310/313; 29/25.35

[56] References Cited
U.S. PATENT DOCUMENTS

| | | | |
|---|---|---|---|
| 3,946,338 | 3/1976 | Schmidt | 310/313 X |
| 3,961,293 | 6/1976 | Hartmann et al. | 333/72 |

Primary Examiner—Alfred E. Smith
Assistant Examiner—Marvin Nussbaum
Attorney, Agent, or Firm—David M. Warren; J. D. Pannone; M. D. Bartlett

[57] ABSTRACT

A reflective grating for a surface acoustic wave device is formed of interleaved sets of contiguous metal strips deposited on the surface of the device. The metal in one set of the strips has a density greater than that of the acoustic propagating medium of the device while the metal of the second set of strips has a density essentially equal to that of the acoustic propagating medium of the device. Typically, a piezoelectric material such as a crystal of quartz or a crystal of lithium niobate is utilized as the base material of the device with the grating being formed of an overlay of alternating strips of gold and aluminum.

6 Claims, 4 Drawing Figures

PROCESSING SEQUENCE FOR ALTERNATING GOLD-ALUMINUM GRATING.

SURFACE ACOUSTIC WAVE GRATING

BACKGROUND OF THE INVENTION

This invention relates to surface acoustic wave devices and, more particularly, to the fabrication of a grating which may be used in bandpass filters.

Gratings have been utilized in surface acoustic wave (SAW) devices for reflecting surface waves back and forth, as in a resonator, or for directing such waves along a path from an input transducer of the device to an output transducer thereof. Such gratings are fabricated typically by a set of discontinuities in the surface of the device, the discontinuities having a form of a set of strips. For example, such strips may be cut into the surface of the device to a depth a small fraction of a wavelength or may be formed by material deposited on the surface of the device to a depth of a small fraction of the wavelength of sound propagating along the surface of the device. Individual strips reflect no more than a small fraction of the total acoustic energy in the surface wave so that, when it is desired to reflect all or nearly all of the energy in the surface wave, a grating of many strips is utilized.

A problem arises in that the use of a grating in the form of an array of many parallel strips produces a radiation pattern, such as that of an end-fire array of sonic radiators, wherein the radiation pattern of the grating is sharply defined over only a relatively small bandwidth of frequencies of the surface wave. Gratings of fewer strips have a broader bandwidth but suffer from a diminution in the total reflected energy.

SUMMARY OF THE INVENTION

The aforementioned problem is overcome and other advantages are provided by a grating for use with SAW devices, particularly SAW filters, wherein, in accordance with the invention, a reflective grating is deposited on the surface of the SAW device. The grating comprises sets of interleaved strips of high and low density materials. In a preferred embodiment of the invention utilizing a quartz substrate for the SAW device, the grating is formed of a deposition of alternate strips of aluminum and gold which are contiguous to each other. The gold strips are spaced apart on centers by one-half the wavelength of the surface acoustic wave propagating along the surface of the substrate. The density of the aluminum is essentially the same as that of the quartz while the density of the gold is much greater than that of the quartz. The thickness of the aluminum strips is approximately equal to or greater than the gold, the thickness being on the order of a small fraction of the acoustic wavelength, to provide greatly increased reflectivity per strip of the grating. As a result, a relatively broad bandwidth grating having a relatively few number of strips provides nearly total reflection of the energy in a surface acoustic wave.

BRIEF DESCRIPTION OF THE DRAWINGS

The aforementioned aspects and other features of the invention are explained in the following description taken in connection with the accompanying drawings wherein.

DESCRIPTION OF THE PREFERRED EMBODIMENT

Figure 1:
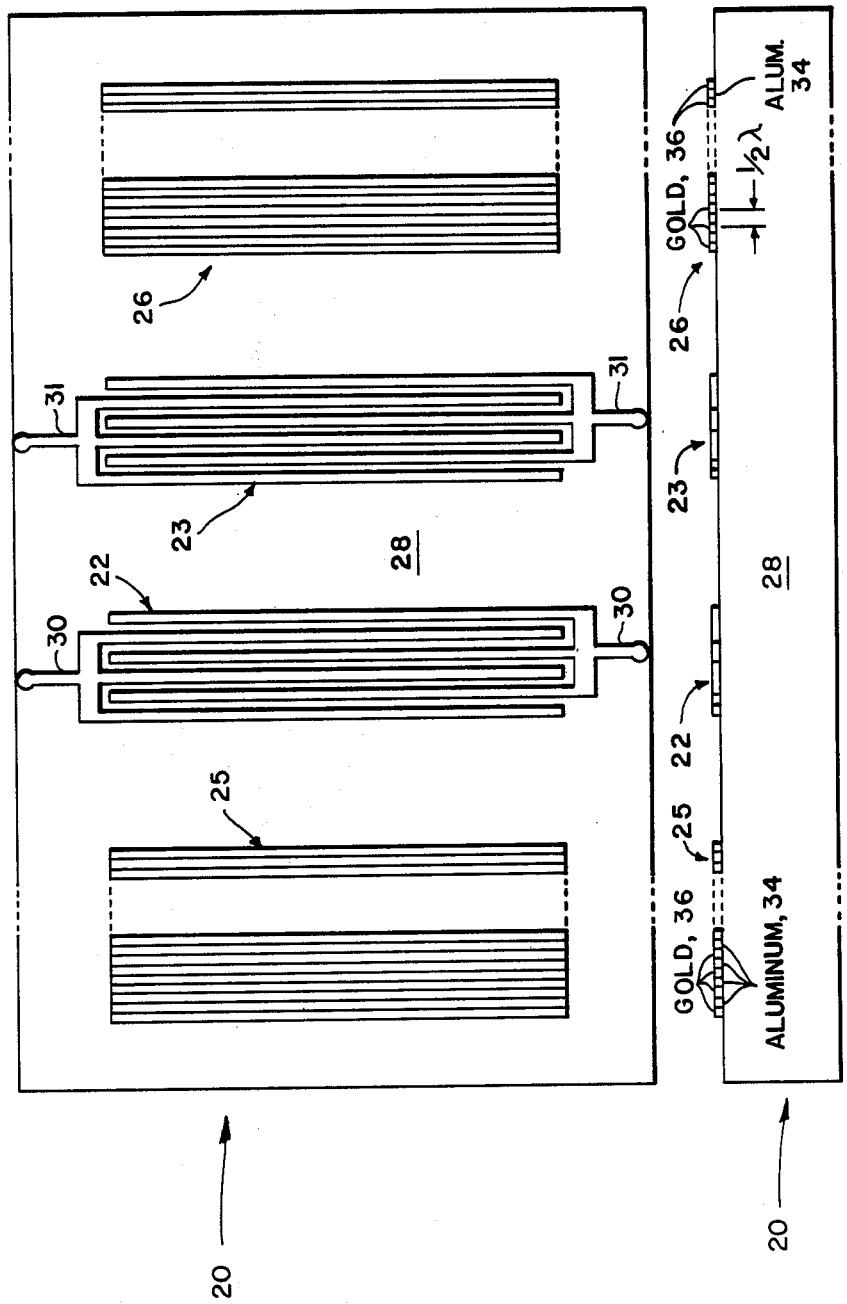
FIGS. 1 and 2 shows respectively a plan view and an elevation view of a SAW resonator or bandpass filter incorporating the invention, the electrode structure of FIG. 2 being exaggerated in the vertical dimension in order to display the construction of a reflecting grating of the invention.
Figure 2:
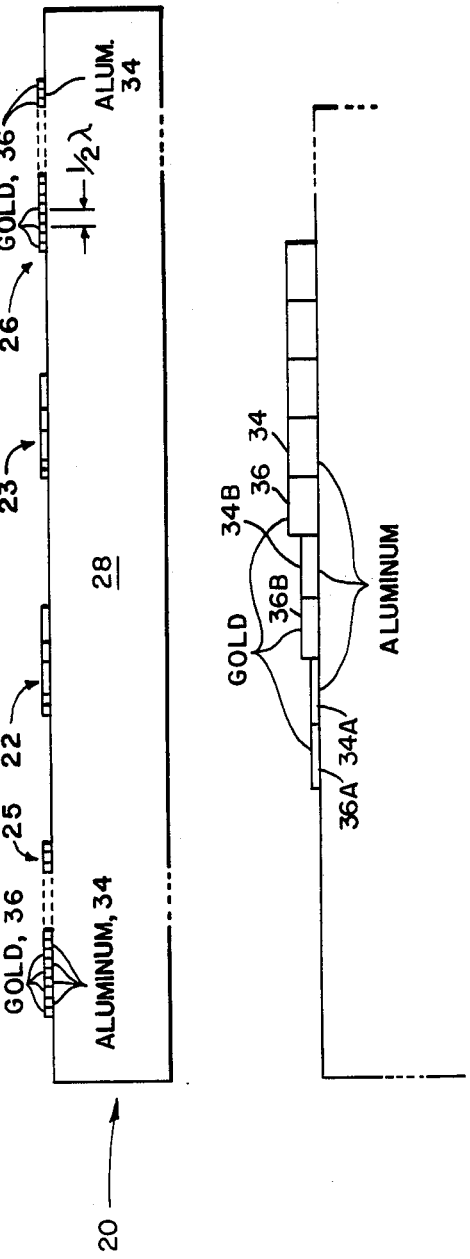

Referring now to FIGS. 1 and 2, a SAW device comprises an input transducer 22, an output transducer 23, and a pair of gratings 25-26 which is mounted upon a substrate 28. The substrate 28 is formed from a crystal of piezoelectric material such as a crystal of quartz or a crystal of lithium niobate. The interdigital electrodes of the transducers 22-23 are formed of aluminum which is deposited on the substrate 28 to a thickness of approximately one percent of the acoustic wavelength of a surface acoustic wave along the surface of the substrate 28. The individual electrodes of the gratings 25-26 are formed of gold deposited on the substrate 28 to a depth approximately equal to or greater than that of the interdigital electrodes of the transducers 22-23. The spacing of centers between the gold electrodes in each of the gratings 25-26 is approximately one-half wavelength of the surface acoustic wave. A similar spacing is employed between neighboring electrodes in each of the transducers 22-23. Electrical signals are coupled to the input transducer 22 via terminals 30 and are coupled from the output transducer 23 via terminals 31.

In accordance with the invention, strips 34 of aluminum are deposited between strips 36 of gold in each of the gratings 25-26. Each of the strips 34 and each of the strips 36 are approximately one-quarter wavelength in width. The strips 34 and 36 are on the order of 100 wavelengths in length while the widths thereof are in the range of one thousandth to one millionth of an inch which corresponds approximately to a SAW frequency range of thirty megahertz to two gigahertz. At a frequency of 60 MHz, the dimensions of a strip 34 or 36 are typically 0.2 inch in length, 500 millionths inch in width, and 1000 angstroms in depth.

Figure 3:
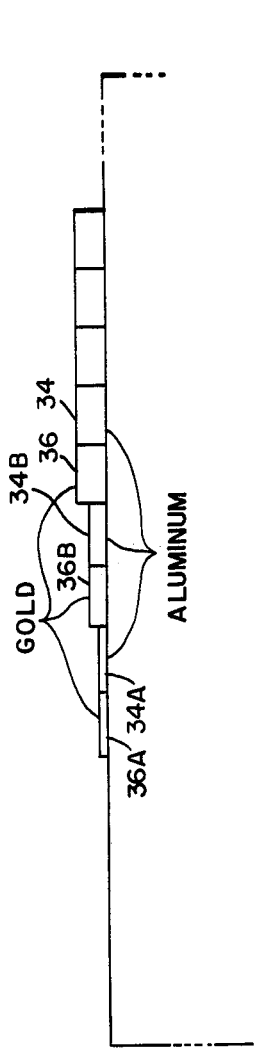
FIG. 3 is an enlarged view of an alternative embodiment of the grating of FIG. 2.

Referring now to FIG. 3, there is seen a portion of a grating 25A which is an alternative embodiment of the grating 25 of FIG. 1. The grating 25A differs from the grating 25 in that the depths of the strips 34 and 36 are gradually reduced at the edge of the grating to produce a taper in depth at the edge of the grating 25 as is shown in FIG. 3. While the depth may be tapered in many steps, two such exemplary steps are shown and are formed by aluminum strips 34A-B and gold strips 36A-B where the suffixes A and B represent differing depths. The taper reduces discontinuities in the overall form of the grating.

Figure 4:
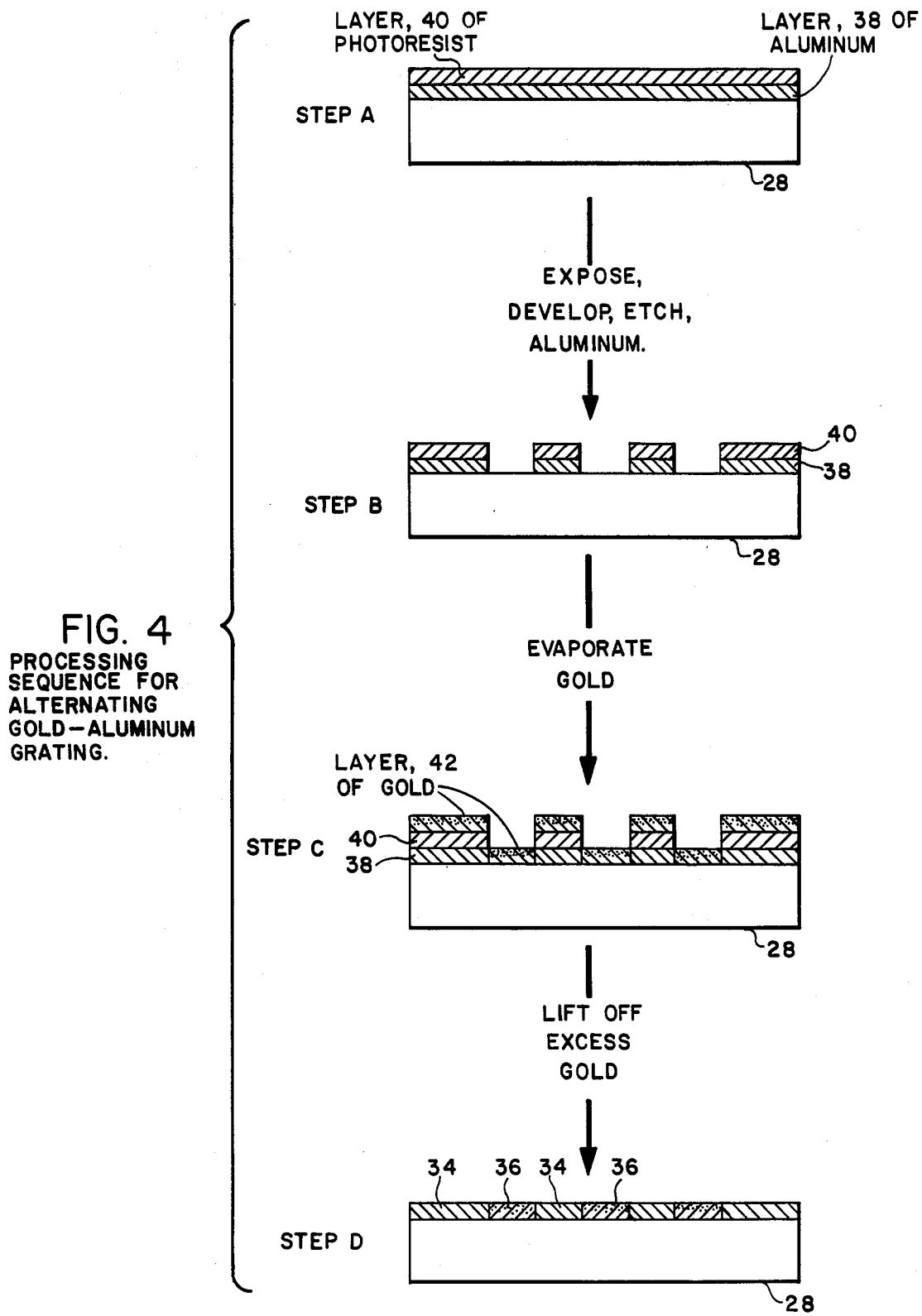
FIG. 4 shows a process for forming the grating of FIGS. 1 and 2.

Referring now to FIG. 4, the procedure for forming a grating such as the grating 25 is disclosed in four steps A-D which are illustrated by successive formations in the development of the grating. The process begins at step A with the deposition of a layer 38 of aluminum on the substrate 28 of silicon dioxide, the deposition being produced by the well known procedure of evaporation of the aluminum in a vacuum. A layer 40 of photoresist material is then deposited upon the layer 38 by the aforementioned process of evaporation in vacuum. The two layers 38 and 40 are seen in step A and are identified in each of the steps A-D by individual cross hatching. The arrangement of the strips 34 and 36 of FIGS. 1-2 is produced photographically, the resulting photograph being reduced in size and, by means of an external source of light (not shown), the photograph of the strips 34 and 36 of the grating 25 is utilized in a conventional manner for exposing the layer 40 of photoresist material with the pattern of the grating 25. Thereupon, the exposed areas of the layer 40 of the photoresist material are dissolved and the resulting exposed areas of the aluminum of the layer 38 are etched away in a conventional manner. The resulting configuration is seen in step B.

A layer 42 of gold is then deposited upon the remaining portions of the layer 40 of the photoresist material and upon the exposed portions of the substrate 28 as shown in step C, the deposition of the gold being done by the aforementioned process of evaporation in a vacuum. To facilitate the deposition of the gold, a relatively thin layer of chromium (not shown in the figures) of approximately 300 angstroms in depth is deposited on the exposed layers of the silicon dioxide of the substrate 28. The layer 42 of gold is identified by a third form of cross hatching in the steps C-D to facilitate its identification in the presence of the layers 38 and 40. In the deposition of the layer 42 of gold, care is taken to insure that the depth of gold does not rise above the layer 40 of the photoresist material. This permits the final step of the procedure wherein a solvent, such as acetone is then applied to the structure of step C to dissolve the remaining portion of the layer 40 of photoresist material and thereby "lift off" the remaining portions of the layer 40 with the portions of the layer 42 deposited thereon. The resultant structure is seen in step D which is seen to represent a portion of the grating 25 of FIGS. 1–2.

With reference to FIG. 2, it is seen that the continuum of material in each of the gratings 25 and 26 may be regarded as an extension of the surface of the substrate 28. The aluminum of the strips 34 has a density which approximates that of the silicon dioxide of the substrate 28. The gold of the strips 36 has a density much greater than that of the silicon dioxide of the substrate 28. Accordingly, the discontinuities in the shape of the surface of the substrate 28 have been minimized while the discontinuity in the relative densities between the strips 34 and 36 is large. It is believed that this configuration of the gratings 25–26 produces increased interaction between a surface acoustic wave and the grating structure for increased reflectivity therefrom. Thereby, the gratings 25 and 26 can be formed of a reduced number of strips 36 as compared with gratings of the prior art while providing sufficient reflection to produce a standing wave therebetween in response to excitation of the standing wave by a signal impressed at the input transducer 22. Due to the decreased number of the strips 36 in each of the gratings 25–26, the aforementioned standing waves can be maintained over a greater range of frequencies with the result that the signal transfer function between an input signal impressed at the transducer 22 and an output signal extracted from the transducer 23 is that of a bandpass filter with greater bandwidth than has been provided heretofore by SAW devices of the prior art.

It is understood that the above-described embodiments of the invention are illustrative only and that modifications thereof may occur to those skilled in the art. Accordingly, it is desired that this invention is not to be limited to the embodiments disclosed herein but is to be limited only as defined by the appended claims.

What is claimed is:

1. A surface acoustic wave device comprising:
    a substrate having a surface thereon for propagating a surface acoustic wave;
    a grating positioned on said surface, said grating having a thickness much smaller than a wavelength of said surface acoustic wave, said grating having a length and a width much greater than a wavelength of said surface acoustic wave; and wherein
    said grating is composed of contiguous strips of first and second materials having respectively first and second densities the difference in density between the density of said first material and the density of said substrate being relatively large while the difference in the density of said second material and the density of said substrate is relatively small to promote increased reflectivity of surface acoustic waves impinging upon said grating.

2. A device according to claim 1 wherein the thickness of the strip of said first material is equal to the thickness of the strip of said second material to provide a smooth surface of said grating.

3. A device according to claim 2 wherein said substrate is a piezoelectric material from the class of piezoelectric materials consisting of lithium niobate and silicon dioxide.

4. A device according to claim 3 wherein said first material is gold and said second material is aluminum.

5. A device according to claim 4 wherein a relatively thin layer of chromium is positioned between said first material and said substrate.

6. A system according to claim 2 wherein strips of said first and second materials located near an end of said grating are provided with thicknesses which taper from a maximum thickness to a minimum thickness, thereby enhancing the continuity of a surface of said grating with the surface of said substrate.

* * * * *